United States Patent [19]

Fossey et al.

[11] Patent Number: 5,988,971

[45] Date of Patent: *Nov. 23, 1999

[54] WAFER TRANSFER ROBOT

[75] Inventors: Michael E. Fossey, Charlotte, N.C.; Kirk Rodney Johnson, Rindge, N.H.; Noel Stephen Poduje, Needham Heights, Mass.

[73] Assignee: ADE Optical Systems Corporation, Charlotte, N.C.

[ * ] Notice: This patent issued on a continued prosecution application filed under 37 CFR 1.53(d), and is subject to the twenty year patent term provisions of 35 U.S.C. 154(a)(2).

[21] Appl. No.: 08/890,575

[22] Filed: Jul. 9, 1997

[51] Int. Cl.⁶ .................................................. B65G 1/04
[52] U.S. Cl. ...................... 414/416; 294/103.1; 294/907; 414/938; 414/941; 901/35
[58] Field of Search ...................... 414/416, 225, 414/938, 941, 811; 294/103.1, 907; 901/35, 39

[56] References Cited

U.S. PATENT DOCUMENTS

| | | | |
|---|---|---|---|
| 4,493,606 | 1/1985 | Foulke et al. | 414/416 X |
| 4,586,743 | 5/1986 | Edwards et al. | 414/938 X |
| 4,603,897 | 8/1986 | Foulke et al. | 414/938 X |
| 4,682,928 | 7/1987 | Foulke et al. | 414/938 X |
| 4,720,130 | 1/1988 | Andou | 414/938 X |
| 4,744,709 | 5/1988 | Hertel et al. | 901/46 X |
| 4,766,389 | 8/1988 | Rhoades et al. | 901/46 X |
| 4,813,732 | 3/1989 | Klem | 414/941 X |
| 4,850,631 | 7/1989 | Dotsko | 901/35 X |
| 4,875,824 | 10/1989 | Moe et al. | 414/941 X |
| 4,886,412 | 12/1989 | Wooding et al. | 414/938 X |
| 4,900,214 | 2/1990 | Ben | 414/941 X |
| 4,944,650 | 7/1990 | Matsumoto | 414/941 X |
| 4,982,333 | 1/1991 | Ackerman et al. | 364/468 |
| 4,986,729 | 1/1991 | Ohlenbusch | 414/416 X |
| 5,022,695 | 6/1991 | Ayers | 414/941 X |
| 5,044,752 | 9/1991 | Thurfjell et al. | 414/416 X |
| 5,133,635 | 7/1992 | Malin et al. | 414/941 X |
| 5,266,812 | 11/1993 | Mokuo | 414/938 X |
| 5,468,111 | 11/1995 | Flint et al. | 414/416 |
| 5,520,501 | 5/1996 | Kouno et al. | 414/941 X |
| 5,642,298 | 6/1997 | Mallory et al. | 414/225 X |
| 5,645,391 | 7/1997 | Ohsawa et al. | 414/416 |
| 5,655,871 | 8/1997 | Ishii et al. | 414/941 X |
| 5,783,834 | 7/1998 | Shatas | 414/941 X |

FOREIGN PATENT DOCUMENTS

| | | | |
|---|---|---|---|
| 9419821 | 9/1994 | WIPO | 414/941 |

OTHER PUBLICATIONS

Water Transfer Robot, Utilizing Capacitve Gage Technology, ADE Optical Systems, May 1996, pp. 1–4.

Guy Mongodin, "Handling Equipment", Semiconductor Production, pp. 31–33, Autumn 1980.

*Primary Examiner*—David A. Bucci
*Attorney, Agent, or Firm*—Alston & Bird LLP

[57] ABSTRACT

In one aspect, the present invention provides an apparatus for transferring wafers to or from a wafer cassette having a plurality of wafer-receiving slots, wherein the apparatus comprises a wafer paddle which is adapted to be inserted into a wafer cassette alongside a wafer. Edge grippers carried by the wafer paddle releasible grip the wafer by its edges. A first capacitive sensor carried by the wafer paddle is oriented in a first direction for sensing information about a wafer in a wafer receiving slot of the wafer cassette. A second capacitive sensor carried by the wafer paddle is oriented in a direction perpendicular to the first direction for sensing additional proximity information about a wafer in a wafer receiving slot of the cassette. A transport mechanism produces movement of the wafer paddle along at least three axes of movement to permit transferring wafers to or from respective wafer receiving slots of the wafer cassette. In a more specific aspect, the transport mechanism produces movement along five axes: relative translational movement along orthogonal x, y and z axes, rotational movement about a rotational axis, and tilting movement of the wafer paddle about a paddle tilt axis.

23 Claims, 5 Drawing Sheets

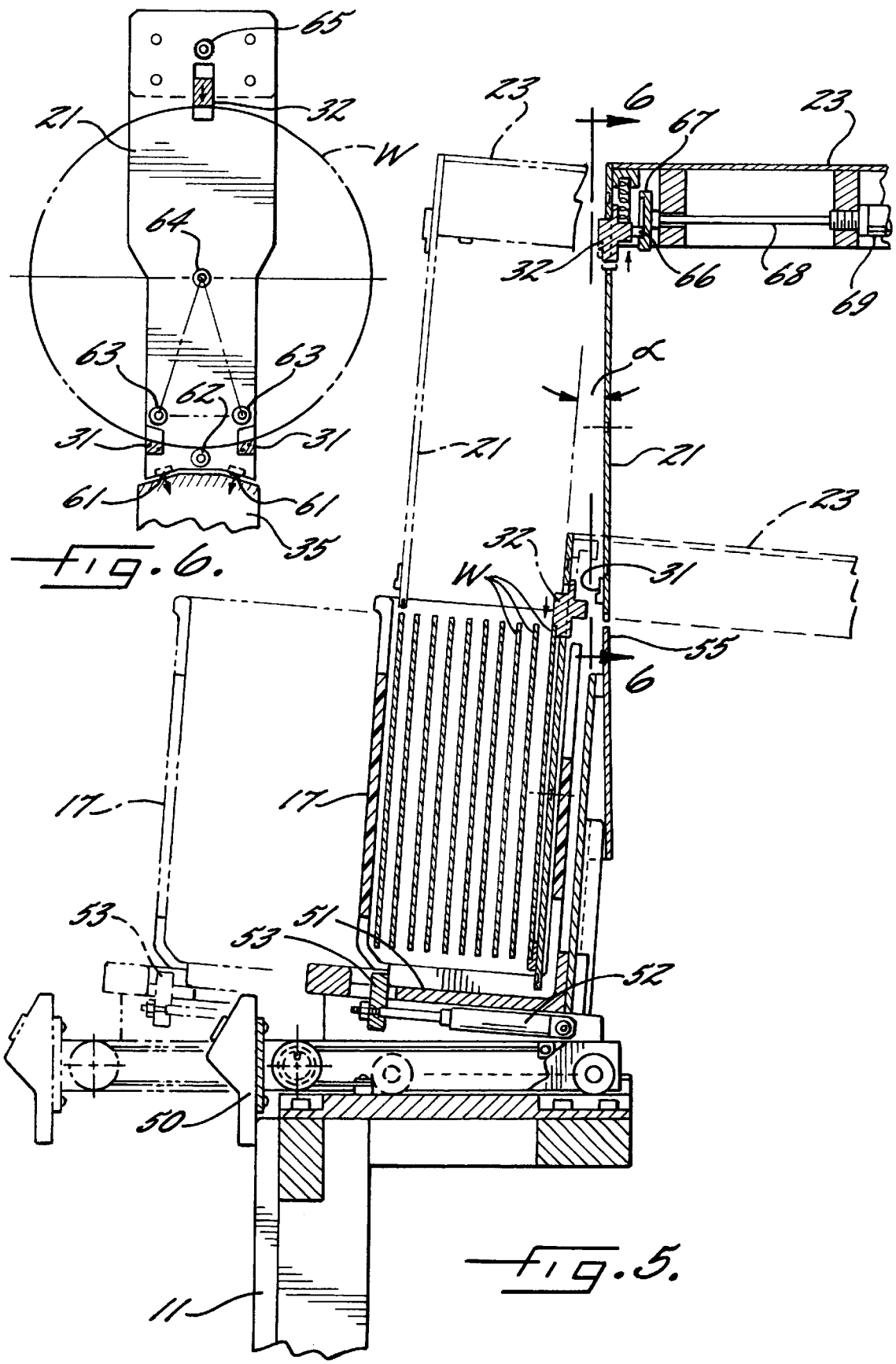

WAFER TRANSFER ROBOT

FIELD AND BACKGROUND OF THE INVENTION

The present invention relates generally to an apparatus and method for transferring wafers, and more particularly to an industrial robot for transferring semiconductor wafers to and from a wafer cassette having a plurality of wafer receiving slots.

In the manufacture of integrated circuits and other computer components, semiconductor wafers are moved through many processing operations or steps, and wafer transfer robots are commonly used for this purpose. Typically, the semiconductor wafers are stored in wafer cassettes for convenience in handling the wafers in groups, and the wafer transfer robot transfers individual wafers to and from the wafer cassettes and to and from various processing operations. It is highly desirable that the wafer transfer robot be capable of handling the semiconductor wafers accurately, reliably and without damaging the surface of the wafer. Throughout the wafer handling process, the robot must maintain very high standards of cleanliness to avoid contamination of the wafer. It is also desirable that the wafer handling apparatus be capable of providing a relatively high wafer throughput while maintaining careful and precise handling of each individual wafer.

SUMMARY OF THE INVENTION

Accordingly, an object of the present invention is to provide a wafer transfer apparatus and method which will precisely and carefully transfer wafers from one location to another without contamination or damage to the wafer surface. A further object of the present invention is to provide a wafer transfer apparatus and method which will transfer wafers to or from a wafer cassette of the type having a plurality of wafer receiving slots. Another object of the invention is to provide a wafer handling apparatus and method in which the wafers are gripped by their edges so as not to contaminate the wafer surface.

The wafer transfer apparatus of the present invention utilizes a wafer paddle which is configured so that it can be inserted into a wafer cassette alongside a wafer. Once inserted into the cassette, edge grippers carried by the wafer paddle can releasably grip the wafer by its edges so as not to contaminate the wafer surface. The wafer paddle can then be removed from the wafer cassette, carrying with it a wafer gripped by its edges. The paddle can then be moved to another location, such as an inspection station or another wafer cassette, where the wafer can be deposited.

The wafer transfer apparatus is provided with noncontact sensors designed for accurately sensing the proximity of the wafer paddle to other objects. The noncontact sensors are used for guiding the paddle as it approaches its destination, for locating the presence of a wafer in a wafer cassette, and also for providing accurate feedback about the paddle location relative to the wafer as the paddle retrieves a wafer from the cassette. In one specific embodiment of the invention, the noncontact sensors are capacative sensors. Capacitive sensors are cost effective and reliable, and their compact size allows them to be easily accommodated in confined spaces.

In accordance with one aspect of the invention, the wafer transfer robot comprises a wafer paddle which is adapted to be inserted into a wafer cassette alongside a wafer and which is provided with edge grippers for releasably gripping the wafer by its edges. A first noncontact sensor carried by the wafer paddle is oriented in a first direction for sensing first information about a wafer in a wafer-receiving slot of the wafer cassette, and a second noncontact sensor carried by said wafer paddle is oriented in a second direction for sensing second information about a wafer in a wafer-receiving slot of the cassette. A transport mechanism moves the wafer paddle along at least three axes of movement to permit transferring wafers to or from respective wafer-receiving slots of the wafer cassette. More specifically, the transport mechanism includes means for producing movement along five axes: relative translational movement along orthogonal x, y and z axes, rotational movement about a rotational axis, and tilting movement of the wafer paddle about a paddle tilt axis.

In accordance with a further aspect of the invention, the wafer transfer robot of the present invention uses two wafer paddles to boost system throughput. The use of two wafer paddles allows the wafer handling apparatus to quickly exchange wafers at a station, thereby minimizing the time a station is waiting for a wafer, and thus increasing throughput. Previous designs using a single wafer paddle require the robot to return a completed wafer back to the cassette prior to retrieving a new wafer.

A further feature of the invention entails maintaining the wafers in a vertical orientation throughout all wafer handling operations. By maintaining the wafers in a vertical orientation, their surfaces are less likely to be contaminated by airborne contamination. The apparatus can provide laminar air flow across the wafer surface helping to reduce contamination from handling by drawing any particular matter away from the wafer. Additionally, in a vertical orientation, gravity does not bow the wafer and therefore more precise measurements of the wafer's shape and surface characteristics can be obtained. Furthermore, vertically positioned wafers are all positively registered on a common surface in the wafer cassette, thereby avoiding vertical misalignment of the wafers. This allows the wafer paddle to scan across an entire cassette of wafers at close proximity without the possibility of a collision between the wafer and the paddle.

In operation, the wafer paddle is used to scan across a cassette of wafers while noncontact sensors configured to look downward determine the presence of a wafer in a given cassette slot. The scanning of the wafer cassette by the wafer paddle also allows for mapping the position of the wafers in a cassette to facilitate subsequent location and retrieval of the wafers. Additionally, the downwardly looking sensors can determine if a wafer is cross-slotted or if two wafers are positioned in one slot.

After a cassette of wafers has been mapped by the downwardly looking sensors, the wafer paddle can be moved and inserted next to any wafer within the cassette for pickup and transport. During this operation, side looking capacitive sensors carried by the paddle assist in the insertion of the wafer paddle by continuously updating the controller with information about wafer proximity. This assures that the wafer paddle is moved without colliding with the wafer.

The side looking noncontact sensors also determine whether the wafer paddle is oriented in the same plane as the wafer. The wafer paddle can be moved on a tilt axis through a very small angle to bring the wafer paddle into a position parallel with the wafer so that the wafer paddle can be accurately positioned for gripping the wafer.

Once the wafer paddle is accurately positioned next to a wafer in a cassette, an edge gripping mechanism is engaged to secure the wafer for transport. Once the wafer is secure, the paddle, along with the wafer, is withdrawn from the cassette and moved to a desired station. The wafer is then gripped by the station handler and the paddle releases the wafer and moves clear of the station.

BRIEF DESCRIPTION OF THE DRAWINGS

Some of the features and advantages of the invention having been described, others will become apparent from the detailed description which follows, and from the accompanying drawings, in which:

FIG. 5 is a fragmentary side cross-sectional view showing various positions of movement of the wafer paddle of the robot relative to a wafer cassette;

FIG. 6 is a side elevational view of the wafer paddle taken substantially along the line 6—6 of FIG. 5;

DESCRIPTION OF ILLUSTRATED EMBODIMENT

Figure 1:
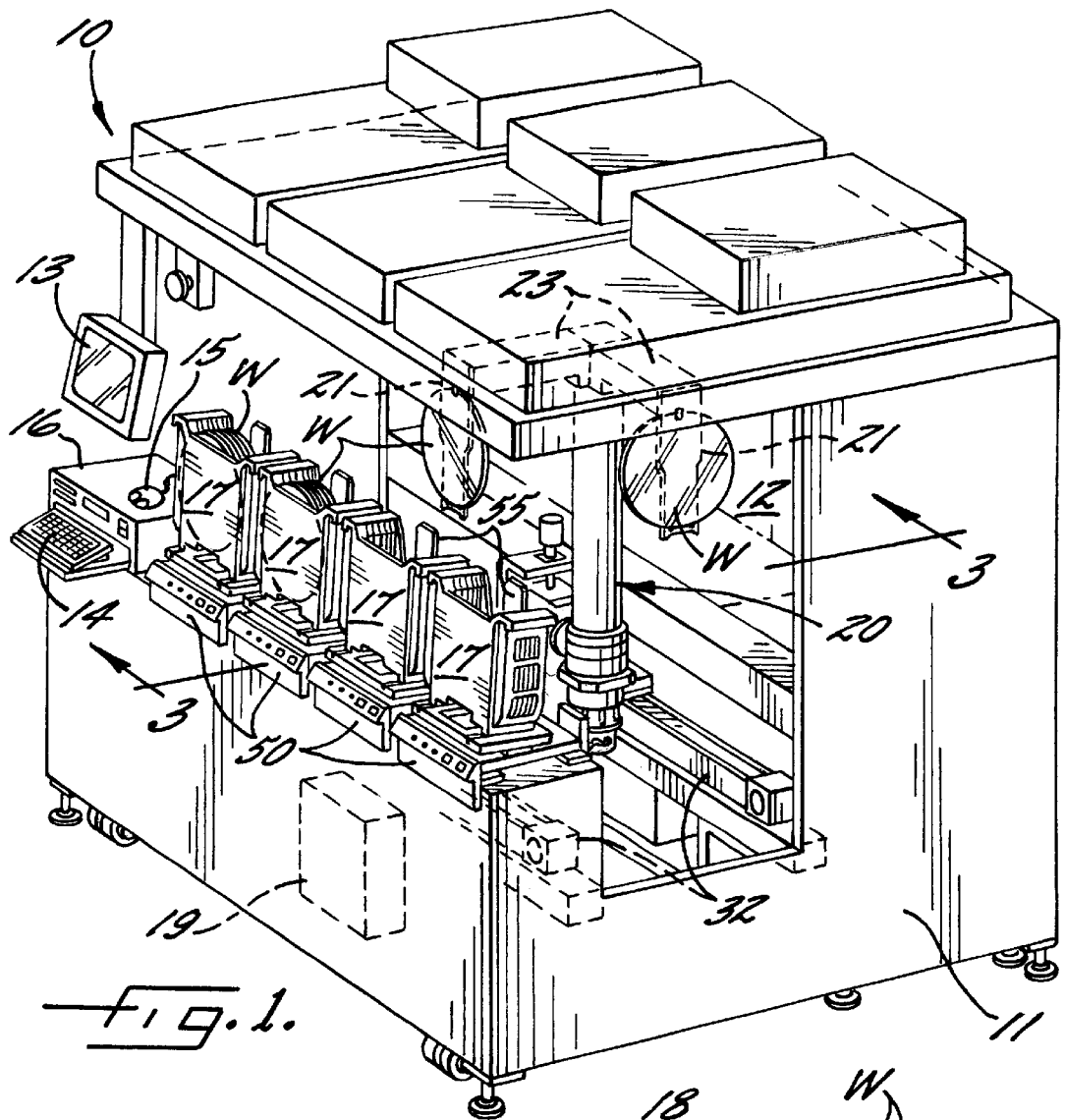
FIG. 1 is a perspective view of a wafer inspection apparatus which incorporates the wafer transfer robot of the present invention.

FIG. 1 illustrates a wafer inspection apparatus which incorporates the wafer transfer robot of the present invention. The wafer inspection apparatus is indicated generally by the reference character 10. It includes a housing 11 in which is mounted a station 12 which is adapted to receive semiconductor wafers for processing or for inspection. The station 12 is disclosed herein merely for purposes of illustration. Those skilled in the art will recognize that the wafer transfer robot of the present invention has broad applicability and can be used with wafer processing or inspection stations of various types or in various other applications or environments where wafers are to be transferred or transported. For examples of several types of semiconductor wafer inspection systems, reference may be made to commonly owned U.S. Pat. Nos. 4,630,276; 5,127,726; 5,329,351 and 5,448,364 which are incorporated herein by reference.

In the specific embodiment illustrated, the wafer station 12 is a laser surface inspection apparatus adapted for scanning the surface of a semiconductor wafer for defects. The wafer inspection apparatus 10 additionally includes a video display 13 and an input device, such as a keyboard 14 and mouse 15. The video display 13, keyboard 14 and mouse 15 are connected to a system controller 16 which interfaces with the inspection station 12 and with a robot controller 19 (FIG. 8) to control the overall operation of the inspection apparatus 10 and provide visible output from the inspection function on the video display 13. In the embodiment illustrated, four slotted wafer cassettes 17 are positioned on the front side of the wafer inspection apparatus for holding groups of semiconductor wafers for inspection at the apparatus. However, it will be understood that the wafer inspection apparatus could equipped with fewer or more wafer cassettes, if desired. As shown, the wafer cassettes are open at the top and are adapted to hold a plurality of wafer W in a generally vertical wafer orientation. Two of the cassettes may be used to for supplying wafers to the apparatus for inspection, with the other two cassettes being used to receive the wafers after inspection.

Figure 2:
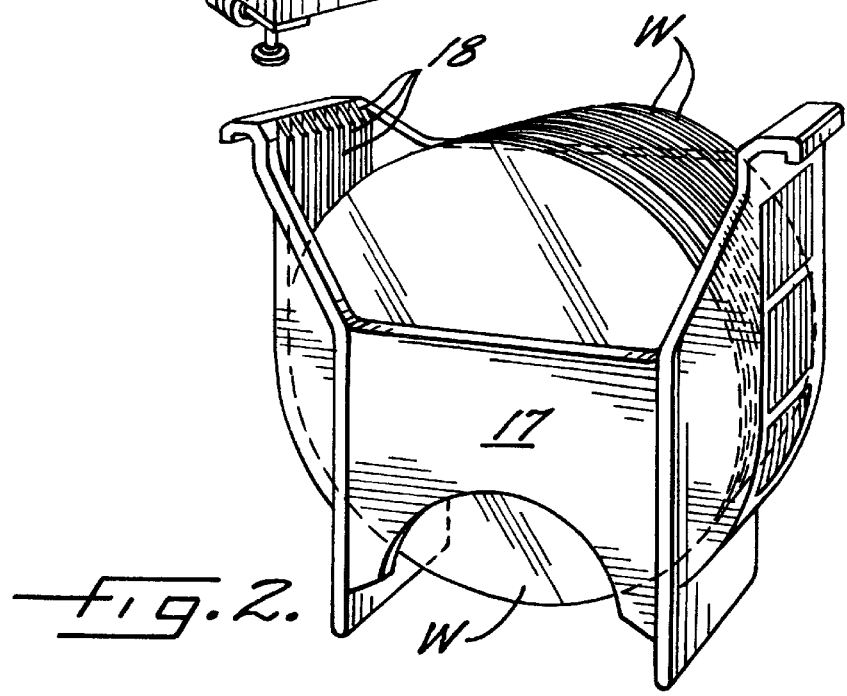
FIG. 2 is a perspective view showing a wafer cassette filled with semiconductor wafers.

A wafer cassette 17 filled with semiconductor wafers W is illustrated in FIG. 2. The cassette is open at the top to receive the wafers and has opposing side walls with vertically extending parallel ribs 18 which define a plurality of vertically oriented slots adapted for receiving the wafers and holding them in spaced apart relation.

Figure 3:
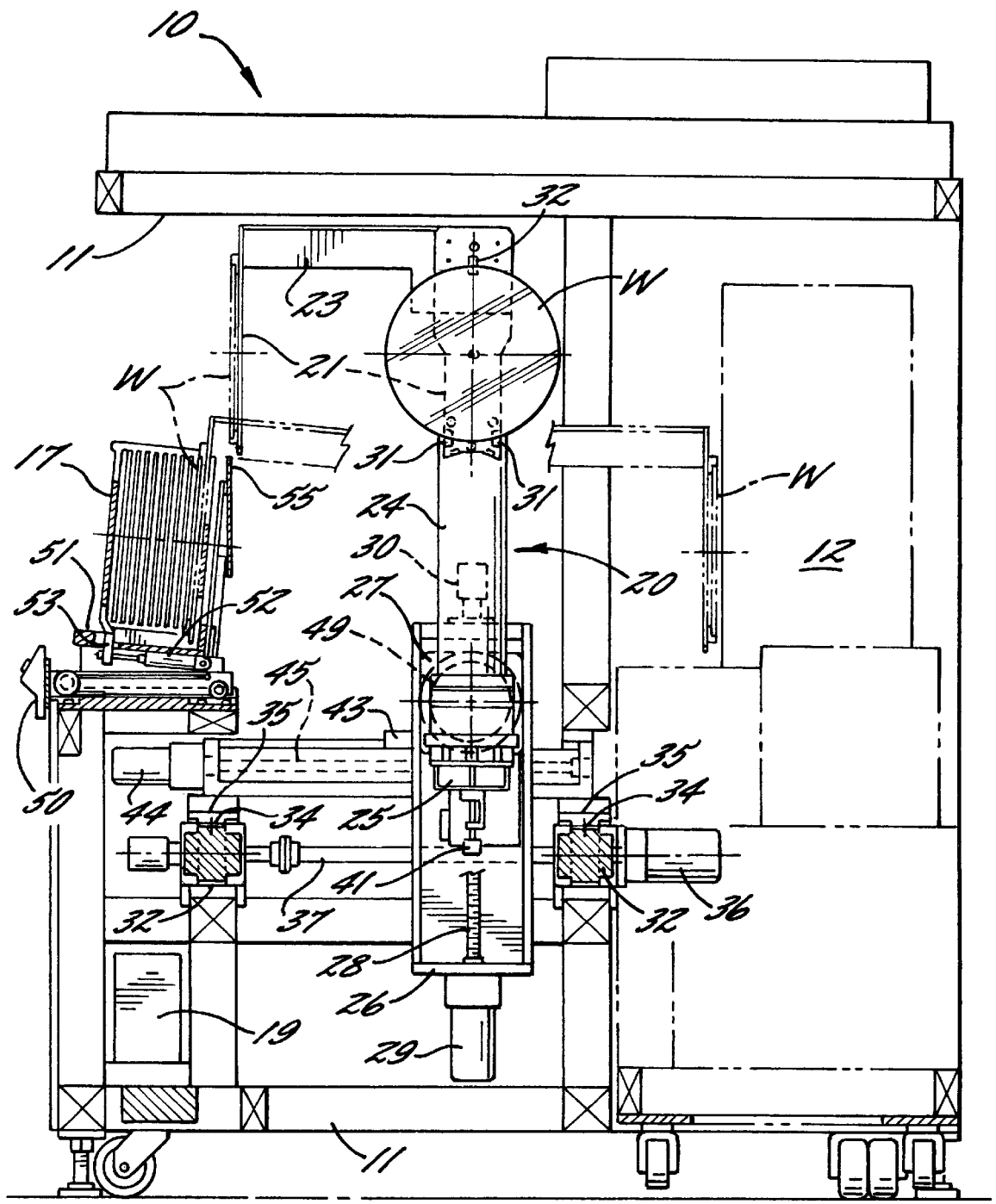
FIG. 3 is a side cross-sectional view of the wafer inspection apparatus, taken substantially along the line 3—3 of FIG. 1.

The wafer transfer robot is generally indicated by the reference character 20. As shown, it includes two wafer handler assemblies, oriented 90 degrees from one another, each being adapted for transporting semiconductor wafers to and from the wafer cassettes 17, and to and from the inspection station 12. As shown more clearly in FIGS. 3 and 4, each wafer handler assembly comprises a wafer paddle 21 which is adapted for being inserted downwardly into a wafer cassette 17 alongside a wafer W. The wafer paddle is in the form of a flat, planar elongate panel which is suspended vertically from its upper end from a support arm 23 with its lower end free. In FIGS. 3 and 5, the flat, planar paddle is shown in solid lines above the wafer cassette 17, and the phantom lines show how the paddle 21 is inserted downwardly into the cassette from its open upper side. A pair of stationary edge grippers 31 are carried by the wafer paddle adjacent the lower end of the paddle. These stationary edge grippers 31 are arranged for being positioned beneath the downwardly facing lower edge portions of a wafer and for engaging and supporting the wafer at two spaced locations along its lower edge. A cooperating movable edge gripper 32 is carried by the wafer paddle 21 at a location above and between the two stationary edge grippers, and is mounted for movement vertically on the wafer paddle 21 so that it can move into engagement with an upper edge of a wafer and grippingly hold the wafer for transport.

Figure 4:
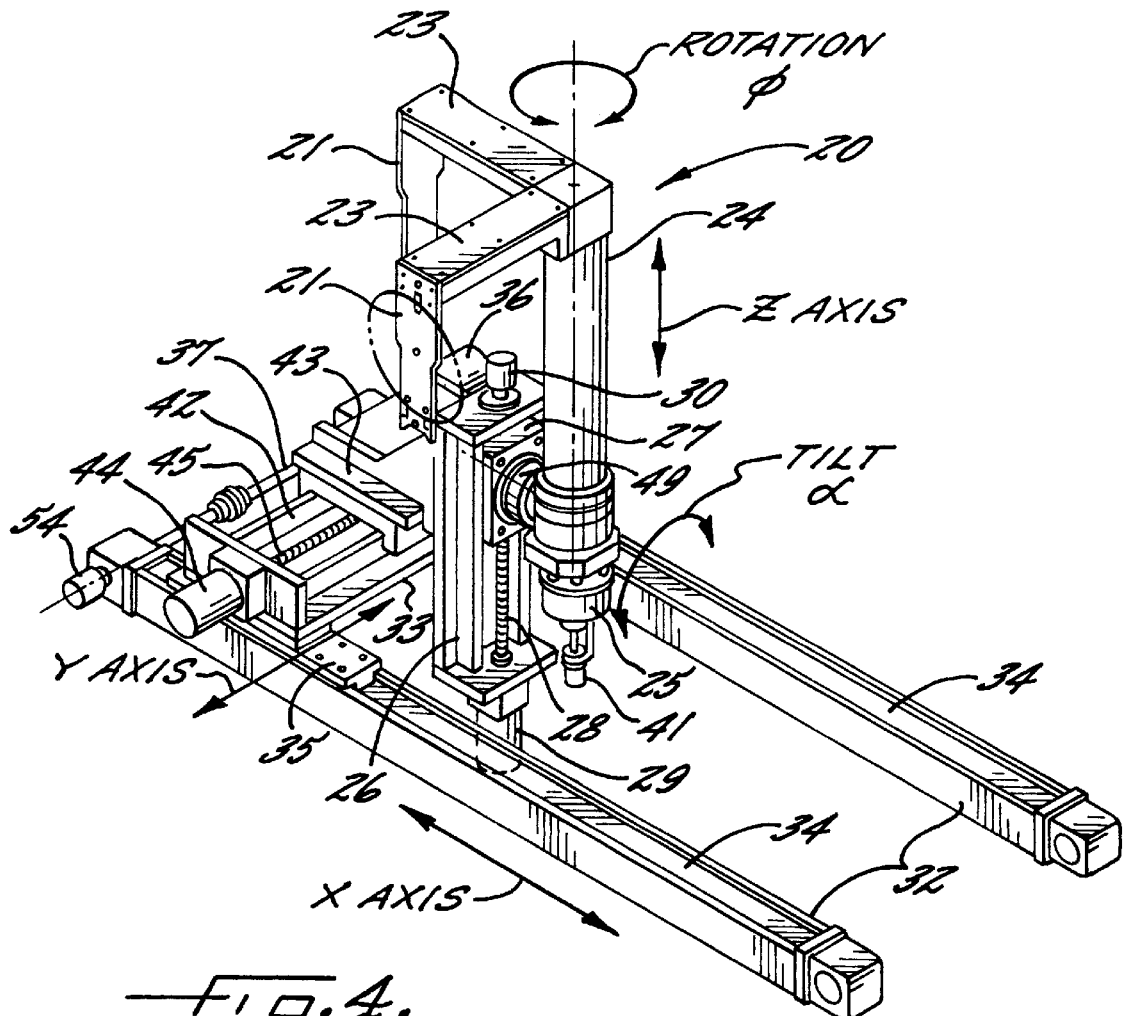
FIG. 4 is a perspective view showing the wafer transfer robot in greater detail.

As best seen in FIG. 4, the wafer transfer robot 20 is designed for moving the wafer paddle 21 in five distinct axes: orthogonal x, y and z axes, a generally vertically extending rotational axis $\phi$, and a paddle tilt axis $\alpha$. In the particular configuration of the wafer inspection apparatus shown in the drawings, the x-axis corresponds to left-to-right movement, the y-axis is front-to-back movement, and the z-axis is up-and-down movement of the wafer paddle. The vertically extending axis of rotation $\phi$ moves each respective wafer paddle 21 into or out of position above the wafer cassette 17. The provision of two wafer handler assemblies allow the robot to quickly exchange wafers at a station without having to travel to or from a wafer cassette, thereby minimizing the time a station is waiting for a wafer, and thus boosting throughput. One wafer handler can remove a previous wafer from the inspection station 12 and the other wafer handler can immediately thereafter place a new wafer at the station. The paddle tilt axis $\alpha$ allows for tilting the wafer paddle a small amount from the vertical plane in order to bring the wafer paddle 21 into a precise position parallel to a wafer in the wafer cassette.

As seen in FIGS. 3 and 5, the wafer cassette 17 is mounted so that the wafers are oriented at a small angle, e.g. 5 degrees, from vertical. Since the slots in the wafer cassette are wider than the thickness of a wafer, this small tilt angle ensures that all wafers are positioned in their respective slots in substantially the same way, all seated at the bottom of the cassette and leaning in the same direction. The paddle tilt axis a allows for tilting the wafer paddle 21 in very small increments to ensure that the paddle is in precise parallel alignment with the wafer and it thus can be inserted alongside a wafer in the slot without risk of contacting the wafer.

The wafer paddles 21 are supported at their upper ends by support arms 23 which project laterally from a support column 24. The vertical axis of the support column 24 coincides with the axis of rotation φ. A suitable motor unit 25 such as a stepper motor, is located at the base of the support column 24 and provides for rotating the support column about the rotational axis φ so that the respective wafer paddles 21 can be moved into or out of position relative to a wafer cassette 17. An encoder 41 associated with the motor shaft provides a signal to the computer system indicating the rotational position of the support column. The support column 24, support arms 23 and wafer paddles 21 are moved as a unit vertically, i.e. in the z axis, by means of a z-axis mounting arrangement which includes a vertically oriented z-axis trackway 26 and a carriage 27 which is mounted for vertical movement along the trackway 26. The carriage 27 is moved vertically by a threaded shaft 28 rotated by a stepper motor 29. An encoder 30 connected to the shaft counts the number of shaft rotations, and thus provides a signal indicative of vertical position of the robot in the z-axis.

A lower portion of the support column 24 is connected to a tilt unit 49, which in turn is supported by the carriage 27. The tilt unit 49 provides for a small amount of rotational movement about a paddle tilt axis α, and includes a suitable motor unit (not visible in FIG. 4), for precisely controlling the amount of rotational movement about the tilt axis α.

The vertical trackway 26 can be moved along orthogonal x and y axes. More particularly, a pair of spaced-apart x-axis support beams 32 are mounted to the frame of the wafer inspection apparatus 10 and extend laterally along the x-axis of movement. A cross beam 33 extends across the support beams 32 along the y-axis of movement. The x-axis support beams are of a hollow construction and are provided with a movable endless flexible steel belt 34 running longitudinally. The belt 34 is exposed along the upper side of the beam, and a bearing plate 35 is connected to the belt 34 and slides along the upper surface of the beam as the belt 34 is moved. A drive motor 36 and associated drive shaft 37 propels the belt 34, thus moving the bearing plate 35 along the x-axis, carrying with it the cross beam 33, which is connected at each end to one of two bearing plates.

The cross beam 33 has a suitably configured y-axis trackway 42 on its upper surface and a y-axis carriage 43 is mounted for movement along the trackway. A drive motor 44 and threaded drive shaft 45 propels the y-axis carriage 43 along the trackway 42 in precise increments of movement. The vertical trackway 26 of the z-axis mounting arrangement is mounted to the y-axis carriage 43.

It will thus be seen that the support beams 32 and the cross beam 33, together with their respective drive motors and carriages, collectively define an x-y table which provides for movement of the support column 24, and hence the wafer paddles 21, along the x and y axes of movement. The z-axis mounting trackway 26 provides for movement of the support column 24 and hence the wafer paddles 21 vertically along the z-axis.

FIG. 5 is a cross-sectional view which shows how the wafers are grasped and removed from the wafer cassette 17. As shown, a cassette drawer 50 is provided on the front of the wafer inspection apparatus 10. The drawer 50 can be pulled forwardly to provide convenient access for loading a wafer cassette 17 onto the apparatus. On the top of the cassette drawer 50 is a cassette platform 51 which is configured for receiving the lower side of a cassette 17. Once a cassette is positioned on the platform 51 and the drawer is pushed forwardly to its closed position, a clamping mechanism 53 driven by actuator 52 is engaged which securely holds the cassette in place during subsequent operations.

Extending upwardly from the wafer platform is a stationary reference target 55. The wafer paddle 21 is shown in solid lines in FIG. 5 in an upwardly extended position with the lowermost edge of the wafer paddle 21 located just above and in alignment with the upper edge of the reference target 55. The broken lines show how the paddle 21 may move into other positions during the transfer operation, as will be explained more fully hereinafter.

As shown in FIG. 6, the paddle 21 is equipped with a pair of downwardly-looking capacitance sensors 61 mounted in the lowermost edge of the paddle 21 and a lower side-looking capacitance sensor 62 located medially of the paddle adjacent its lower edge and just below the stationary edge grippers 31. During downward movement of the paddle into a slot of the cassette, this side-looking sensor 62 determines when the lower end of the paddle 21 has cleared the lower edge of the wafer. Located above the stationary edge grippers is a pair of side-looking sensors 63. These sensors 63, and a third side-looking sensor 64 located medially of the paddle 21 sense the proximity of the wafer to the paddle. More particularly, the two sensors 63 and the third sensor 64 work in triangulation to sense whether the paddle is oriented parallel to the wafer. If the system determines that the paddle is not oriented precisely parallel, the tilt unit 49 is activated to correct the paddle orientation. A topmost side-looking capacitive sensor 65 is located adjacent the upper end of the paddle 21. This sensor 65 is used to guide the paddle during docking operations at the inspection station 12. The moveable edge gripper 32 is mounted medially of the paddle 21 adjacent its upper end and is mounted for upward and downward sliding movement as indicated by the arrow. As shown in FIG. 5, a cam follower 66 on the back side of the edge gripper 32 engages a cam 67 which is rotated by a camshaft 68 suitably driven by a motor 69.

Figure 7:
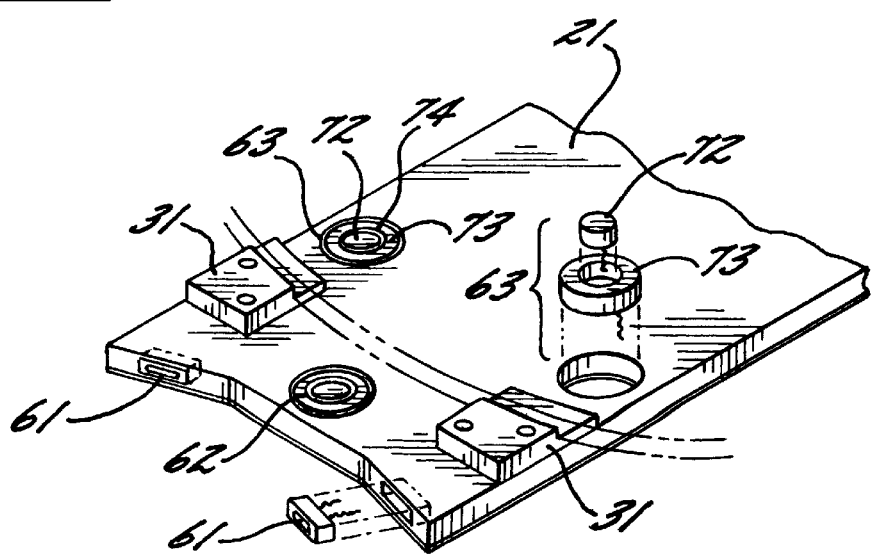
FIG. 7 is an exploded perspective detail view of a portion of the wafer paddle.

FIG. 7 is an exploded view of the lower end of the paddle 21 and shows how the capacitive sensors are constructed and mounted in the paddle. The downward-looking capacitive sensors 61 are received in a slot formed in the lower edge of the paddle. The side-looking sensors 62–65 are received in holes formed in the paddle. The capacitive sensors 61–65 can be constructed in any of a number of ways. In the illustrated embodiment, each of the side-looking sensors 62–65 has a disk shaped center conductor 72 and a surrounding metallic guard ring 73. The center conductor 72 is mounted inside the guard ring 73 by an insulating epoxy composition 74. The downward-looking sensors 61 are of similar two-piece construction, but of a rectangular configuration, and include a metallic center conductor and a surrounding metallic guard ring. The exposed face of the smaller center conductor acts as the sensor. The guard ring surrounding the center conductor is driven at the same potential as the sensor and helps to collimate the field of the sensor and to reduce non-linearity due to fringing. It also minimizes leakage paths from the sensor to its surroundings, which could degrade performance of the sensor. The center conductor and its surrounding guard ring is potted with an epoxy into the paddle. One end of the sensor is connected to a shielded cable whose conductor connects to the sensors and the shield connects to the guard ring. The cable leads back to the sensor electronics located in the housing of the apparatus.

The basic theory behind the functioning of the capacitive gauge is the inversely proportional relationship between the distance and capacitance of two parallel plates. The governing equation defining this relationship is:

$$C = K \times \varepsilon_o \times \frac{A}{d}$$

Where:

C is capacitance of sensor/target combination;

K is the dielectric constant of the medium between the plates;

$\varepsilon_o$ is the permittivity of free space;

A is the plate area; and d is the distance between the plates.

The sensor is one plate of the capacitor and the target (e.g. the wafer in this case) is the other plate of the capacitor. Since the sensor area is smaller than the target area, the sensor area is the approximate substitution for "A". The dielectric constant (K) is 1.00 for air as the medium. Therefore, the distance between the sensor and the wafer defines the electrical capacitance, which can be electronically measured to determine the actual sensor to wafer distance. The use of capacitive sensors is described more fully in the article "Using Capacitive Sensing for Noncontact Dimensional Gauging" from October 1988 edition of *Sensors,* by Helmers Publishing, Inc., which is incorporated herein by reference.

Operation

The functions and operation of the wafer transfer robot of the present invention will be understood more fully from the following discussion which describes how the wafer transfer robot operates in the particular wafer inspection apparatus 10 illustrated herein. At the beginning of an inspection operation, a cassette 17 filled with semiconductor wafers W is positioned at the inspection apparatus in one of the two left-most positions shown. The other left-most position is available for receiving a second cassette of uninspected wafers while the apparatus is carrying out its inspection functions on the first cassette. In this way, once inspection of the first cassette full of wafers is completed, the inspection operations can continue with the second cassette while the first cassette is being removed and replaced with another cassette of uninspected wafers. At the beginning of the inspection cycle, the wafer transfer robot moves to the location of the new cassette of wafers with the support column 24 in the fully extended upward position so that the wafer paddle 21 will clear the top of the wafer cassette. After moving in the x-axis until the robot is centered in front of the cassette, the wafer paddle then moves in the Y direction so that the downward looking sensors at the bottom of the wafer paddle pass over the reference target 55 located adjacent the wafer cassette. As seen in FIGS. 5 and 6, the reference target 55 has an upper surface located at the level of the top of the wafer cassette 17. The downward looking sensors 61 on the paddle 21 sense the presence of the reference target 55 and thus confirm that the robot is at the proper position opposite the wafer cassette. The paddle 21 is then moved in the y-axis toward the front of the machine and across the top of the cassette, which allows the downward looking sensors 61 to scan each slot location, sensing the presence or absence of the wafer's upper edge at each slot. In this manner, the system "maps" the presence or absence of wafers in each respective slot of the cassette. This "map" information is stored in memory to be used later when fetching wafers from the cassette.

Having now "mapped" the wafer locations, the robot moves along the y-axis to the first selected wafer location. The downward looking sensors sense the presence of the upper edge of the wafer and provide feedback for assuring that the wafer paddle is aligned above the wafer top edge. The wafer paddle then moves downwardly in the z-axis direction to insert the wafer paddle 21 into the slot alongside the wafer. As the paddle moves downwardly, the lowermost side-looking sensor 62 senses the proximity of the wafer paddle 21 to the wafer. As the paddle is inserted further into the cassette slot, the three triangularly arranged side looking sensors 63 and 64 sense not only the spacing of the paddle from the wafer paddle, but also sense whether the paddle is oriented parallel to the wafer. If not, these sensors provide a signal which causes the tilt unit 49 to rotate support column 24 slightly on the paddle tilt axis α to bring the paddle into parallel alignment with the wafer. As the paddle nears the fully downwardly extended position, the lowermost side looking sensor 62 senses when it passes the lowermost edge of the wafer, thus indicating that the lowermost stationary edge grippers 31 are now located alongside and below the wafer lower edge. The paddle can then be moved laterally a small distance to position the laterally extending ledge portions of the grippers 31 beneath the wafer lower edge. At this point, the top edge gripper 32 is moved downwardly to clamp the wafer in position on the paddle. The paddle 21 is then raised upwardly to remove the wafer from the cassette.

The robot 20 is now moved along the x-axis and the y-axis to transport the wafer to its intended destination. Thus, for example, it may transport the wafer to the inspection station 12 and deposit it there for inspection. Prior to depositing the wafer at the inspection station, the robot 20 may be rotated on its vertical rotational axis φ to bring the second wafer paddle 21, which at that time is empty, into operative position at the inspection station 12 for removing a previously inspected wafer from the inspection station. Having now removed a previously inspected wafer from the inspection station with the second paddle, the robot can rotate on its rotational axis φ once more to position the first wafer paddle in operative position at the inspection station for depositing the wafer.

Now the robot 20 can transport the previously inspected wafer, held in the second wafer paddle, to its intended destination. For example, the result of the wafer inspection at the inspection station 12 may determine that the wafer is sufficiently defect free to allow for further processing. If so, the wafer may be deposited in one of the two empty cassettes shown at the right side of the machine in FIG. 1. On the other hand, if defects are found in the wafer, that wafer may be returned to the original supply cassette so that it can be recleaned or repolished. All of these movements of the wafer transfer robot are governed by a computer system operating under appropriate software control.

Figure 8:
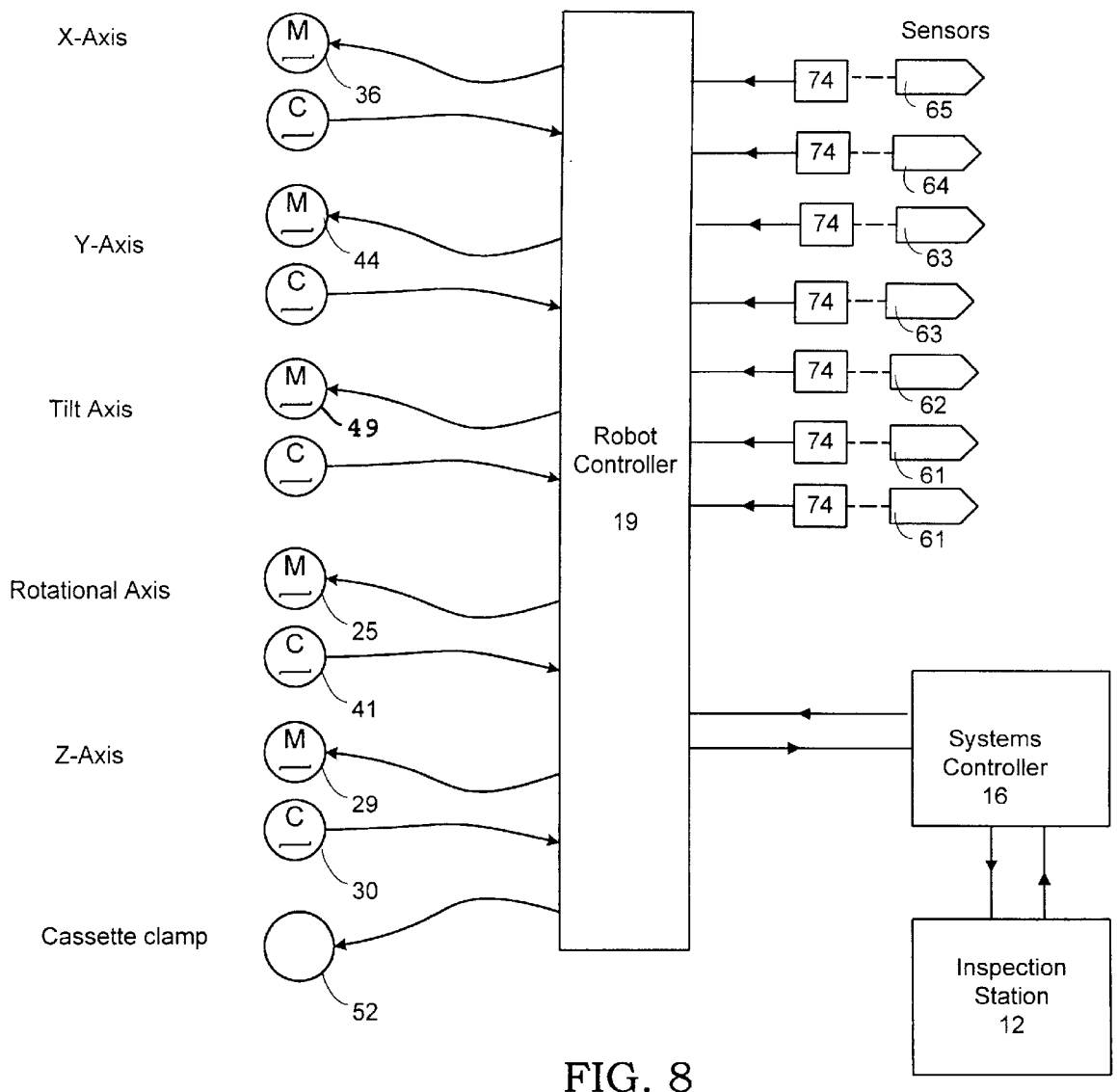
FIG. 8 is a schematic illustration of the sensor and motor controls.

FIG. 8 generally illustrates the interconnection of the capacitance sensors (61–65) and the drive motors to the robot controler 19. Each capacitance sensor 61 to 65 is connected to a driver/interface 74 and then, in turn to the robot control system 19 to provide information regarding the proximity of the sensors to a wafer or other object. The motors 36, 44, 49, 29, and 25 which drive the respective five axes of movement receive control signals from the robot controller 19, and the respective encoders associated with each motor provide positional feedback information to the robot controller. The actuator 52 for the cassette clamp is also controlled by a signal from the robot controller 19. The robot controller communicates with the system controller 16, and the inspection system 12 also sends and receives control information to and from the system controller 16.

That which is claimed is:

1. Apparatus for transferring wafers to or from a wafer cassette having a plurality of wafer-receiving slots, said apparatus comprising:

a wafer paddle adapted to be inserted into a wafer cassette alongside a wafer;

edge grippers carried by said wafer paddle for releasably gripping the wafer by its edges;

a first noncontact sensor carried by said wafer paddle and oriented in a first direction for sensing first position information about a wafer in a wafer-receiving slot of the wafer cassette;

a second noncontact sensor carried by said wafer paddle and oriented in a second direction for sensing second position information about a wafer in a wafer-receiving slot of the cassette;

a transport mechanism for producing movement of said wafer paddle along at least three axes of movement to permit transferring wafers to or from respective wafer-receiving slots of the wafer cassette; and a controller operatively connected to said first and second sensors for receiving position signals therefrom, the controller being connected to said transport mechanism and operable to control said transport mechanism so as to adjust positioning of said paddle during a transfer operation in response to the position signals when either or both of the position signals indicate misalignment of the paddle with respect to the wafer.

2. Apparatus according to claim 1, wherein said transport mechanism includes means for producing relative translational movement along orthogonal x and y axes, and also for producing tilting movement of said wafer paddle along a paddle tilt axis.

3. Apparatus according to claim 2, wherein said transport mechanism includes means for producing movement along five axes: relative translational movement along orthogonal x, y and z axes, rotational movement about a rotational axis, and tilting movement of said wafer paddle about a paddle tilt axis.

4. Apparatus according to claim 3, wherein said transport mechanism comprises a support column mounted for rotational movement about said rotational axis and an arm projecting from said support column, and wherein said wafer paddle is carried by said arm.

5. Apparatus according to claim 4, including a second wafer paddle having edge grippers for releasably gripping the wafer by its edges and being adapted to be inserted into a wafer cassette alongside a wafer, and a second arm projecting from said support column and mounting said second wafer paddle to said support column so that said first and second paddles move as a unit in response to movement of said support column about said rotational axis.

6. Apparatus according to claim 3, wherein said transport mechanism includes an x-y table for producing movement along said x and y axes, and said support column is mounted on said x-y table for translational movement along said x and y axes.

7. Apparatus according to claim 6, wherein said support column includes means for moving said arm along a z axis substantially parallel to said axis of rotation.

8. Apparatus according to claim 1, wherein said wafer paddle is mounted from one end and has a free end adapted to be inserted into a wafer cassette, and wherein said first noncontact sensor is located at said free end of the paddle and oriented for sensing the presence of a wafer beyond said free end of the wafer paddle.

9. Apparatus according to claim 8, wherein said first noncontact sensor comprises at least one capacitive sensor.

10. Apparatus according to claim 8, wherein said first noncontact sensor comprises a pair of capacitive sensors located in spaced relation to one another at said free end of the wafer paddle.

11. Apparatus according to claim 8, wherein said second noncontact sensor is located in a face of said paddle and is oriented outwardly from the face of the paddle in for sensing the presence of a wafer alongside the paddle.

12. Apparatus according to claim 11, wherein said second noncontact sensor comprises at least one capacitive sensor.

13. Apparatus according to claim 11, wherein said second capacitive sensor comprises three capacitive sensors located in a triangular arrangement on said face of the paddle.

14. Apparatus for transferring wafers, said apparatus comprising:

a wafer cassette having a plurality of wafer-receiving slots;

a wafer paddle positionable adjacent said wafer cassette alongside a wafer-receiving slot for being inserted into said wafer cassette alongside a wafer;

edge grippers carried by said wafer paddle for releasably gripping the wafer by its edges;

a capacitive sensor carried by said wafer paddle and oriented facing said wafer cassette for sensing a wafer in said cassette and providing a position signal indicative of presence of said wafer;

a transport mechanism for producing relative translational movement between said wafer cassette and said wafer paddle so as to scan said capacitive sensor past successive wafer-receiving slots of the wafer cassette; and a controller connected with said capacitive sensor for logging information about wafers in successive wafer-receiving slots of the wafer cassette, the controller being operatively connected with said transport mechanism and operable to control said transport mechanism so as to position said paddle proximate a wafer in order to permit said paddle to be inserted into said cassette alongside the wafer and to adjust positioning of said paddle when said position signal indicates misalignment of the paddle with respect to the wafer.

15. Apparatus according to claim 14, wherein said controller includes means for mapping the wafer positions in the respective wafer-receiving cassette slots upon scanning of said capacitive sensor along said wafer cassette.

16. Apparatus according to claim 14, wherein said controller includes means for determining the presence or absence of a wafer in a given cassette slot and means for detecting a mis-loaded wafer in a given cassette slot.

17. Apparatus according to claim 14, wherein the wafer-receiving slots of said wafer cassette are oriented for holding the respective wafers in a generally vertical plane for insertion or removal from above, and said wafer paddle is located above the wafer cassette with said capacitive sensor facing downwardly for sensing a wafer therebelow.

18. Apparatus according to claim 17, additionally including a transport mechanism for inserting the wafer paddle vertically into the wafer cassette alongside a wafer, and a side-looking capacitive sensor carried by said wafer paddle and cooperating with said transport mechanism for providing information to assist in positioning the wafer paddle relative to the wafer during wafer pick-up.

19. Apparatus for transferring wafers, said apparatus comprising:
- a wafer cassette having a plurality of generally vertically oriented wafer-receiving slots arranged for holding wafers in spaced apart relationship in a generally vertical orientation;
- a paddle support positionable above said wafer cassette;
- a wafer paddle having an upper end carried by said paddle support, a free lower end, and a substantially planar body; said wafer paddle being oriented parallel to the slots of said cassette to permit insertion of the paddle downwardly into a slot of said cassette alongside a wafer;
- edge grippers carried by said wafer paddle for releasably gripping the wafer by its edges;
- a plurality of spaced-apart capacitive sensors carried by said substantially planar paddle body and oriented laterally in a direction perpendicular to the paddle surface for sensing wafer proximity when the paddle is inserted into said cassette alongside a wafer;
- a transport mechanism for moving said paddle into said cassette alongside a wafer and being operable to move said paddle about a tilt axis; and
- a controller connected to said capacitive sensors and operatively connected to said transport mechanism, the controller being operable to detect when said paddle is non-parallel to the plane of the wafer based on signals from said capacitive sensors and to cause said transport mechanism to move said paddle about the tilt axis to bring said paddle into an orientation parallel to the plane of the wafer.

20. Apparatus according to claim 19, wherein said transport mechanism is operable to move said paddle support along orthogonal x, y and z axes relative to said wafer cassette.

21. Apparatus according to claim 20, further comprising a pair of downwardly-looking capacitive sensing elements mounted at said free end of said paddle and located in spaced relation to one another for sensing wafer proximity at two spaced locations along the top edge of a wafer.

22. Apparatus for grasping and transferring wafers comprising:
- a paddle support;
- a wafer paddle having one end carried by said paddle support, an opposite free end, and a substantially planar surface adapted to positioned alongside a wafer;
- edge grippers carried by said planar surface said wafer paddle for releasably gripping the wafer by its edges;
- a first capacitive sensor carried by said wafer paddle at said free end thereof and oriented for sensing first wafer proximity information in a direction parallel to the paddle surface;
- a second capacitive sensor carried by said wafer paddle on said planar surface thereof and oriented for sensing second wafer proximity information in a direction perpendicular to the paddle surface;
- a transport mechanism for moving said paddle along a plurality of directions including directions parallel to and perpendicular to the paddle surface; and
- a controller coupled with said transport mechanism and arranged to receive signals from said first and second capacitive sensors, said controller being operable to cause said transport mechanism to adjust positioning of said paddle when the signal from at least one of said capacitive sensors indicates misalignment of said paddle with respect to a wafer.

23. Apparatus according to claim 22, wherein said edge grippers include a pair of stationary edge grippers projecting from said surface of said paddle and positioned for engaging a wafer at two spaced locations on its edge, and a movable edge gripper positioned in spaced relation to said stationary edge grippers and mounted for movement toward or away therefrom to permit engaging an opposite edge of the wafer, and wherein said apparatus further comprises a third capacitive sensor cooperating with said movable gripper for providing information about the proximity of the movable gripper to the wafer edge.

* * * * *

UNITED STATES PATENT AND TRADEMARK OFFICE
CERTIFICATE OF CORRECTION

PATENT NO. : 5,988,971
DATED : November 23, 1999
INVENTOR(S) : Fossey et al.

It is certified that error appears in the above-identified patent and that said Letters Patent is hereby corrected as shown below:

On the Title page, item [56]:

In the References Cited, OTHER PUBLICATIONS, line 1, "Water" should read --Wafer--; "Capacitve" should read --Capacitive--.

In the Abstract, line 6, "releasible" should read --releasably--.

Column 10, line 12, after "paddle" cancel "in".

Column 12, line 6, after "to" insert --be--; line 7, after "surface" insert --of--.

Signed and Sealed this

Eighth Day of August, 2000

Attest:

Q. TODD DICKINSON

*Attesting Officer*          *Director of Patents and Trademarks*